US009240486B2

(12) United States Patent  (10) Patent No.: US 9,240,486 B2
Cho  (45) Date of Patent: Jan. 19, 2016

(54) THIN-FILM TRANSISTOR, METHOD FOR MANUFACTURING THE SAME AND DISPLAY DEVICE INCLUDING THE SAME

(71) Applicant: LG Display Co., Ltd., Seoul (KR)

(72) Inventor: HyungNyuck Cho, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/095,278

(22) Filed: Dec. 3, 2013

(65) Prior Publication Data

US 2014/0291635 A1  Oct. 2, 2014

(30) Foreign Application Priority Data

Mar. 29, 2013 (KR) .......................... 10-2013-0034429

(51) Int. Cl.
| H01L 29/08 | (2006.01) |
| H01L 35/24 | (2006.01) |
| H01L 51/00 | (2006.01) |
| H01L 29/786 | (2006.01) |
| H01L 29/66 | (2006.01) |
| H01L 29/417 | (2006.01) |

(52) U.S. Cl.
CPC .... H01L 29/78618 (2013.01); H01L 29/41733 (2013.01); H01L 29/66969 (2013.01); H01L 29/7869 (2013.01); H01L 29/78696 (2013.01)

(58) Field of Classification Search
USPC .................................................... 257/40, 43
See application file for complete search history.

(56) References Cited

U.S. PATENT DOCUMENTS

| 8,659,015 | B2* | 2/2014 | Yoneda | 257/43 |
| 2009/0256203 | A1 | 10/2009 | Kisdarjono et al. | |
| 2009/0321732 | A1 | 12/2009 | Kim et al. | |
| 2012/0088339 | A1 | 4/2012 | Molin et al. | |
| 2012/0175615 | A1* | 7/2012 | You et al. | 257/57 |
| 2012/0223304 | A1* | 9/2012 | Yoneda | 257/43 |
| 2013/0256652 | A1* | 10/2013 | Lee et al. | 257/43 |
| 2014/0117353 | A1* | 5/2014 | Yoneda | 257/43 |

FOREIGN PATENT DOCUMENTS

JP  2008-146091 A  6/2006
KR  10-2012-0053768 A  5/2012

OTHER PUBLICATIONS

PCT International Search Report for PCT/KR2013/012245, Apr. 15, 2014, 3 Pages.

* cited by examiner

*Primary Examiner* — Telly Green
(74) *Attorney, Agent, or Firm* — Fenwick & West LLP

(57) ABSTRACT

A thin-film transistor, a method for manufacturing the same and a display device including the same are provided. The thin-film transistor may include a substrate, and an active layer formed on the substrate. The active layer may be made from an oxide semiconductor. A gate electrode may be formed above the active layer or below the active layer. A conductive layer may come in contact with the active layer, may be overlapped with at least a part of the gate electrode, and may be insulated from the gate electrode. A source electrode and a drain electrode may be electrically connected to the active layer. The conductive layer can reduce a channel length of the thin-film transistor and increase a capacitance between the source electrode and the gate electrode or between the drain electrode and the gate electrode.

19 Claims, 11 Drawing Sheets

THIN-FILM TRANSISTOR, METHOD FOR MANUFACTURING THE SAME AND DISPLAY DEVICE INCLUDING THE SAME

CROSS-REFERENCE TO RELATED APPLICATIONS

This application claims the priority of Korean Patent Application No. 10-2013-0034429 filed on Mar. 29, 2013, in the Korean Intellectual Property Office, the disclosure of which is incorporated herein by reference.

BACKGROUND OF THE INVENTION

1. Field of the Invention

The present invention relates to a thin-film transistor, a method for manufacturing the thin-film transistor and a display device including the thin-film transistor, and more particularly, to a thin-film transistor capable of improving driving characteristics, a method for manufacturing the thin-film transistor and a display device including the thin-film transistor.

2. Description of the Related Art

Recently, with growing interest in information displays and an increasing demand for portable electronic devices, light and thin-film type flat panel display (FPD) devices have been widely studied and commercialized. In particular, among the flat panel displays, liquid crystal display (LCD) devices and organic light-emitting diode (OLED) devices have been widely studied, and a thin-film transistor (TFT) has been used as a switching element and/or a driving element in the LCD device and the OLED device.

A channel region of the thin-film transistor means a path of carriers caused when a gate voltage is applied between a source electrode and a drain electrode. Typically, the current driving ability of the thin-film transistor (TFT) deteriorates as the channel length increases. To compensate for the deterioration of the TFT, the driving voltage can be increased. Higher driving voltage, however, results in decreased power efficiency and lifespan of the TFT.

SUMMARY OF THE INVENTION

Accordingly, an improved thin-film transistor is provided. In an embodiment, a thin-film transistor according to an exemplary embodiment of the present invention may include a substrate, and an active layer formed on the substrate. The active layer may be made from a semiconductor. A gate electrode may be formed above the active layer or below the active layer. A conductive layer may come in contact with the active layer, may be overlapped with at least a part of the gate electrode, and may be insulated from the gate electrode. A source electrode and a drain electrode may be electrically connected to the active layer. The conductive layer can reduce a channel length of the thin-film transistor. Accordingly, a driving current of the thin-film transistor can be increased, and a driving voltage of the thin-film transistor can be decreased. The conductive layer can increase a capacitance between the source electrode and the gate electrode or between the drain electrode and the gate electrode. Accordingly, it is possible to improve driving characteristics of the thin-film transistor.

In one aspect, the present invention relates to a display device. In an embodiment, the display device according to an exemplary embodiment of the present invention may include a switching transistor, a driving transistor and an organic light-emitting diode. The switching transistor may include a gate electrode connected to a gate wiring, a first electrode connected to a data wiring, and a second electrode. The driving transistor may include a gate electrode connected to the second electrode of the switching transistor, a first electrode connected to a power supply wiring, and a second electrode. The organic light-emitting diode may have an anode, an organic light-emitting layer and a cathode that are connected to the driving transistor. A first capacitor and a second capacitor may be formed between the gate electrode of the driving transistor and the second electrode of the driving transistor. The first capacitor and the second capacitor may be connected in parallel. Since the first capacitor and the second capacitor are connected in parallel, the total capacitor value between the gate electrode of the driving transistor and the second electrode of the driving transistor is increased. Accordingly, a voltage transmission rate of a date voltage in the display device can be enhanced.

In yet another aspect, the present invention relates to a method of manufacturing a TFT. In an embodiment, the method for manufacturing a thin-film transistor according to an exemplary embodiment of the present invention may include forming a conductive layer on a substrate, forming an active layer that comes in contact with the conductive layer on at least a partial region of the conductive layer, forming a insulating layer on the active layer, forming a gate electrode on the insulating layer, and forming a source electrode and a drain electrode that are electrically connected to the active layer, respectively.

BRIEF DESCRIPTION OF THE DRAWINGS

The above and other aspects, features and other advantages of the present invention will be more clearly understood from the following detailed description taken in conjunction with the accompanying drawings.

DETAILED DESCRIPTION OF THE PREFERRED EMBODIMENT

Figure 1A:
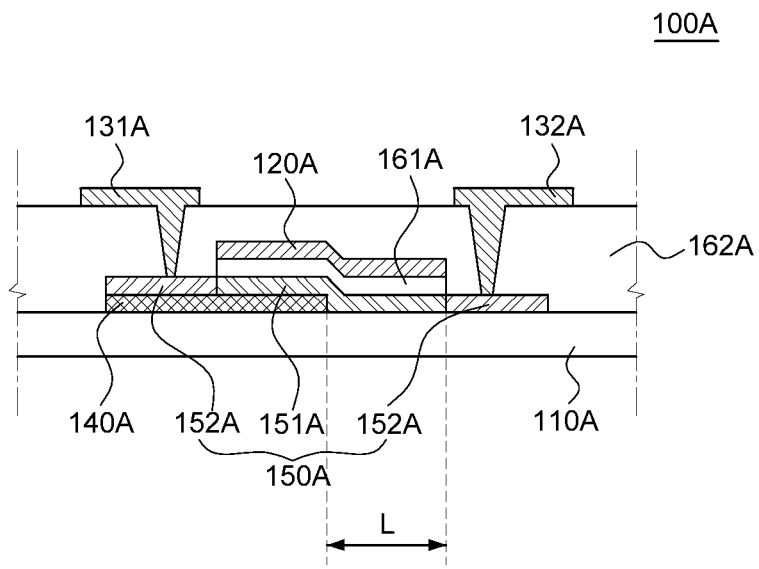
FIGS. 1A to 1G are cross-sectional views of thin-film transistors according to various exemplary embodiments of the present invention.

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

An element or layer disposed or formed "on" another element or layer includes all a case in which an element is formed in direct physical contact with another element, as well as cases in which an element is indirectly physically connected with another element with one or more additional elements or layers formed therebetween.

The term "electrically connected" refers to two different elements or layers that are in direct physical contact or are indirectly connected through one or more intervening elements or layers such that an electrical current is capable of flowing between the two different elements or layers.

In this specification, like numbers refer to like elements throughout the description of the drawings.

Sizes and thicknesses of respective elements shown in the drawings are shown for the sake of convenience of description only and are not intended to limit the scope of the present invention.

The inventors of the present invention have found that since the alignment among a gate electrode, a source electrode and a drain electrode are taken into account in a thin-film transistor having an inverted-staggered structure while preventing a short circuit between the source electrode and the drain electrode from occurring, there is a difficulty in short channel design in the thin-film transistor having an inverted-staggered structure. Furthermore, the inventors of the present invention have found that since a channel length depends on a width of a gate electrode in a thin-film transistor having a coplanar structure, it is difficult to minimize the channel length in terms of a design margin of the thin-film transistor. Accordingly, the inventors of the present invention have suggested a novel thin-film transistor structure and a method for manufacturing the same with which it is possible to reduce a channel length of the thin-film transistor while maintaining widths and an arrangement of the existing electrodes.

Exemplary embodiments of the present invention will now be described in detail with reference to the accompanying drawings.

FIG. 1A is a cross-section view of an exemplary thin-film transistor according to an embodiment of the present disclosure. Referring to FIG. 1A, a thin-film transistor 100A includes a substrate 110A, a conductive layer 140A, an active layer 150A, a gate insulating film 161A, a gate electrode 120A, an interlayer insulating film 162A, a source electrode 131A and a drain electrode 132A. In FIG. 1A, among various thin-film transistors, a thin-film transistor having a coplanar structure will be described.

The substrate 110A is a member for supporting various elements that can be formed on the substrate 110A. The substrate 110A may be made from an insulating material such as glass or plastic, but is not limited thereto. The substrate may be made from various materials.

The substrate 110A may be made from various materials depending on various applications in which the thin-film transistor 100A is used. For example, when the thin-film transistor 100A is used in a flexible display device, the substrate 110A may be made from a flexible insulating material. Here, examples of the available flexible insulating material include polyimide (PI), polyetherimide (PEI), polyethyelene terephthalate (PET), polycarbonate (PC), polystyrene (PS), styrene-acrylonitrile copolymer (SAN), and silicone-acrylic resin. Further, when the thin-film transistor 100A is used in a transparent display device, the substrate 110A may be made from a transparent insulating material.

The conductive layer 140A is formed on the substrate 110A. The conductive layer 140A is formed to reduce a channel region of the thin-film transistor 100A, and may be made from a conductive metal material. The conductive layer 140A may be made from the same material as that of the gate electrode 120A to be described below, or may be made from the same material as those of the source electrode 131A and the drain electrode 132A. The conductive layer 140A comes in contact with the active layer 150A to be described below, is overlapped with at least a part of the gate electrode 120A, and insulated from the gate electrode 120A. Accordingly, the conductive layer 140A can reduce a channel length of the thin-film transistor 100A. For example, it is possible to reduce a current channel length of about 9 μm up to 4.5 μm by forming the conductive layer 140A.

The active layer 150A is formed on the substrate 110A. The active layer 150A is also referred to as an activation layer, and may be a layer including an oxide semiconductor. Various metal oxides may be used as the oxide semiconductor of the active layer 150A. For example, examples of a constituent material of the oxide semiconductor includes a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O)-based material, and a tin-aluminum-zinc-oxide (Sn—Al—Zn—O)-based material, and a binary metal oxide such as an indium-zinc-oxide (In—Zn—O)-based material, a tin-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective oxide semiconductor materials are not particularly limited, and may be adjusted at various composition ratios. The active layer 150A may be formed by depositing the oxide semiconductor material on the substrate 110A and then patterning the oxide semiconductor material so as to allow only the oxide semiconductor corresponding to a size of the active layer 150A desired to be formed to be remained.

The active layer 150A includes a first region 151A serving as a general oxide semiconductor region to which electrical conductivity has not been given (e.g., no addition of charge carriers through plasma treatment) and second regions 152A serving as oxide semiconductor regions to which electrical conductivity has been given (e.g., addition of charge carriers through plasma treatment). The first region 151A of the active layer 150A is the part of the active layer 150A being overlapped with the gate electrode 120A. The second region 152A of the active layer 150A is the part of the active layer 150A that is not overlapped by the gate electrode 120A. The first region 151A and second regions 152A of the active layer are laterally next to each other, as they are both part of the active layer.

In the present specification, electrical conductivity having been given to the oxide semiconductor does not necessarily mean that the oxide semiconductor has become a perfect conductor, but rather means that the oxide semiconductor has been treated to have properties to cause to it to act more like a conductor to another oxide semiconductor that has not been similarly modified. For example, electrical conductivity having been given to the oxide semiconductor means that the oxide semiconductor has been treated to have a carrier concentration of $10^{17}/m^3$ or more.

The second regions 152A of the active layer 150A are regions to which electrical conductivity has been given and have higher electrical conductivity than that of the first region 151A of the active layer 150A to which electrical conductivity has not been given. Thus, the second regions may be referred to as low-resistance regions.

Some portions of the active layer 150A (including, in some embodiments, portions of the first and second regions) are formed on the conductive layer 140A to come in contact with the conductive layer 140A. Specifically, a part of the first region 151A and at least some portion of the second region 152A of the active layer 150A may be formed directly on the conductive layer 140A.

The gate insulating film 161A is formed on the active layer 150A. The gate insulating film 161A insulates the active layer 150A from the gate electrode 120A. The gate insulating film 161A may be a silicon oxide film, a silicon nitride film or multiple layers including the silicon oxide film and the silicon nitride film, but is not limited thereto. The gate insulating film may be made from various materials. The gate insulating film 161A may be formed over the entire surface of the substrate 110A including the active layer 150A. However, since the gate insulating film 161A has only to insulate the active layer 150A from the gate electrode 120A, the gate insulating film 161A may be formed only on the active layer 150A as shown in FIG. 1A. When the gate insulating film 161A is formed only on the entire surface of the substrate 110A, the gate insulating film 161A may be formed so as to have contact holes for opening partial regions of the active layer 150A, and the contact holes may open partial regions of the second region 152A of the active layer 150A.

The gate electrode 120A is formed on the gate insulating film 161A. The gate electrode 120A is overlapped with at least a part of the active layer 150A, specifically, the first region 151A of the active layer 150A. As shown in FIG. 1A, the gate electrode 120A may be formed to have the substantially same area as that of the gate insulating film 161A. The gate electrode 120A being formed to have the substantially same area as that of the gate insulating film 161A includes a case where the areas of the gate electrode 120A and the gate insulating film 161A on a contact surface between the gate electrode 120A and the gate insulating film 161A are not completely the same due to a deviation in the process.

The gate electrode 120A is made from a conductive material, for example, molybdenum (Mo), aluminum (Al), chrome (Cr), gold (Au), titanium (Ti), nickel (Ni), neodymium (Nd) and copper (Cu), or an alloy thereof, but is not limited thereto. The gate electrode may be made from various materials. Moreover, the gate electrode 120A may be multiple layers made from any one selected from a group consisting of molybdenum (Mo), aluminum (Al), chrome (Cr), gold (Au), titanium (Ti), nickel (Ni), neodymium (Nd) and copper (Cu), or an alloy thereof.

The gate insulating film 161A and the gate electrode 120A are formed only on the first region 151A of the active layer 150A. As stated above, the first region 151A of the active layer 150A is the general oxide semiconductor region to which electrical conductivity has not been given, and the second regions 152A of the active layer 150A are the oxide semiconductor region to which electrical conductivity has been given. In order to give electrical conductivity to only the second regions 152A of the active layer 150A, the gate insulating film 161A and the gate electrode 120A are formed on the first region 151A of the active layer 150A, and then hydrogen-plasma treatment or helium-plasma treatment is performed only on the second regions 152A of the active layer 150A by using the gate insulating film 161A and the gate electrode 120A as masks. In this way, it is possible to give electrical conductivity to only the second regions 152A of the active layer 150A.

The interlayer insulating film 162A is formed on the gate electrode 120A. The interlayer insulating film 162A may be made from the same material as that of the gate insulating film 161A. The interlayer insulating film may be a silicon oxide film, a silicon nitride film or multiple layers including the silicon oxide film and the silicon nitride film, but is not limited thereto. The interlayer insulating film may be made from various materials. The interlayer insulating film 162A may be formed over the entire surface of the substrate 110A, and the source electrode 131A and the drain electrode 132A may be electrically connected to the active layer 150A through contact holes of the interlayer insulating film 162A.

The source electrode 131A and the drain electrode 132A are formed on the interlayer insulating film 162A. The source electrode 131A and the drain electrode 132A may contact the second regions 152A of the active layer 150A through the contact holes that are formed in the interlayer insulating film 162A and/or the gate insulating film 161A. The source electrode 131A and the drain electrode 132A are made from conductive materials. The source electrode 131A and the drain electrode 132A may be made from any one of, for example, molybdenum (Mo), aluminum (Al), chrome (Cr), gold (Au), titanium (Ti), nickel (Ni), neodymium (Nd) and copper (Cu), or an alloy thereof, but is not limited thereto. The source electrode and the drain electrode may be made from various materials. Further, the source electrode 131A and the drain electrode 132A may be multiple layers made from any one selected from a group consisting of molybdenum (Mo), aluminum (Al), chrome (Cr), gold (Au), titanium (Ti), nickel (Ni), neodymium (Nd) and copper (Cu), or an alloy thereof.

The source electrode 131A and the drain electrode 132A each come in contact with one of the second regions 152A of the active layer 150A. The second region 152A of the active layer 150A in contact with the source electrode 131A is separated, both electrically and physically, from the second region 152A of the active layer 150A in contact with the drain electrode 132A. One of the second region 152A of the active layer 150A in contact with the source electrode 131A and the second region 152A of the active layer 150A in contact with the drain electrode 132A comes in contact with the conductive layer 140A.

For the sake of convenience in description, it has been illustrated in FIG. 1A that the second region 152A of the active layer 150A in contact with the source electrode 131A comes in contact with the conductive layer 140A, but the present invention is not limited to such illustration. The second region 152A of the active layer 150A in contact with the drain electrode 132A may come in contact with the conductive layer 140A. In the thin-film transistor 100A according to the exemplary embodiment of the present invention, the source electrode 131A comes in contact with the second region 152A of the active layer 150A, and the second region 152A of the active layer 150A in contact with the source electrode 131A comes in contact with the conductive layer 140A. Further, the conductive layer 140A comes in contact with a partial region of the first region 151A of the active layer 150A, and the conductive layer 140A is overlapped with at least a part of the gate electrode 120A.

For example, the first region 151A of the active layer 150A may be formed between two separate second regions 152A formed at the opposite ends of the active layer 150A. One of the second regions 152A may be electrically connected with the source electrode while the other second region 152A may be electrically connected with the drain electrode. The conductive layer 140A being overlapped with a part of the first region 151A may overlap with any one of the second regions 152A. As such, the conductive layer 140A may overlap with some part or entirety of the second region 152A at the source electrode side. Likewise, the conductive layer 140A may overlap with some part or entirety of the second region 152A at the drain electrode side. Also, the thin-film transistor 100A may employ two separate conductive layers, each configured to overlap with a part of the first region 151A and at least some portion of one of the second regions 152A, to further reduce the channel length of the thin-film transistor.

Accordingly, when a gate voltage is applied to the gate electrode 120A between the source electrode 131A and the drain electrode 132A to turn on the thin-film transistor 100A, current is allowed to intensively flow by the conductive layer 140A which is made from a metal material and has a relatively higher carrier concentration other than the first region 151A of the active layer 150A which is overlapped with the conductive layer 140A, is made from an oxide semiconductor, and has a relatively lower carrier concentration.

For clarity, the first region 151A may be subdivided, for purposes of description only, into two portions. A first portion (not separately labeled) of the first region 151A is the portion of the first region 151A that is overlapped by the gate electrode 120A and the gate insulating film (or layer) 161A but not the conductive layer/s 140A. The first portion of the first region 151A is where the channel of the transistor will form when appropriate voltages are applied to the transistor. A second portion (also not separately labeled) of the first region 151A is the portion of the first region 151A that is overlapped by the gate electrode 120A, the gate insulating film 161A, and the conductive layer/s 140A.

In the example shown in FIG. 1A, the conductive layer 140A serves as an extension of the source electrode 131A, and thus the first portion of the first region 151A of the active layer 150A which does not overlap with the conductive layer 140A becomes the channel region of the thin-film transistor. In other words, the channel length becomes the distance "L" shown in FIG. 1A, which is obtained by subtracting a length of the conductive layer 140A overlapped with the gate electrode 120A (e.g., the length of the second portion of the first region 151A) from the entire width of the first region 151A of the active layer 150A. In this case, the channel length of the oxide semiconductor thin-film transistor can be reduced to the length between an end of the first conductive layer and an end of the second conductive layer that face each other (e.g., the length of the first portion of the first region 151A).

In addition, the distance between the conductive layer 140A and overlapping source/drain electrodes can be configured such that capacitance is formed therebetween. This additional capacitance, in turn, increases the total capacitance between the source electrode and the gate electrode and/or between the drain electrode and the gate electrode. Accordingly, it is possible to improve driving characteristics of the thin-film transistor.

Figure 1B:
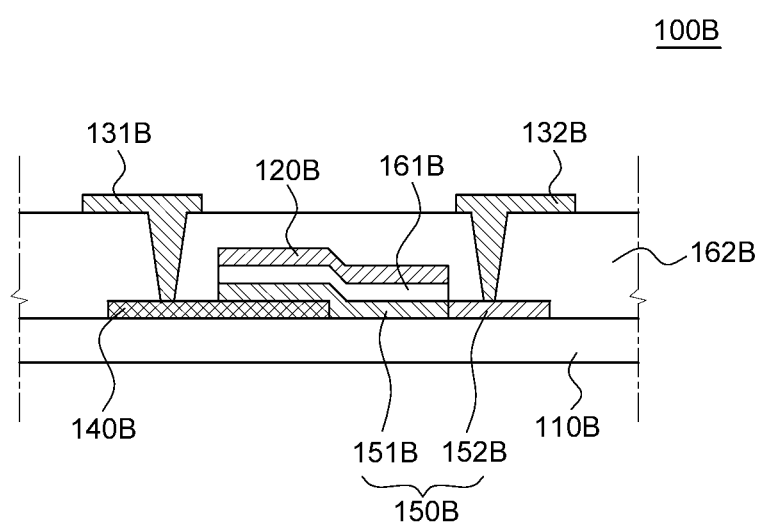

FIG. 1B is a cross-sectional view of a thin-film transistor according to an exemplary embodiment of the present invention. The conductive layer 140B comes in direct contact with one of a source electrode 131B and a drain electrode 132B, and the other electrode, which is not in direct contact with the conductive layer 140B, is in contact with the second region 152B of the active layer 150B. In this case, as described with reference to FIG. 1A, since the conductive layer 140B serves as the extension of the source electrode 131B, it is possible to reduce a length of the channel region by a length of the conductive layer 140B overlapped with the gate electrode 120B as compared with a case where the conductive layer 140B is not used. Furthermore, since the source electrode 131B comes in direct contact with the conductive layer 140B made from a conductive metal material, it is possible to reduce a contact resistance between the source electrode 131B and the conductive layer 140B and a resistance between the source electrode 131B and the channel region.

For the sake of convenience in description, it has been illustrated in FIG. 1B that the source electrode 131B comes in contact with the conductive layer 140B and the drain electrode 132B comes in contact with the second region 152B of the active layer 150B, but the present invention is not limited to such illustration. The drain electrode 132B may come in contact with the conductive layer 140B, and the source electrode 131B may come in contact with the second region 152B of the active layer 150B.

Figure 1C:
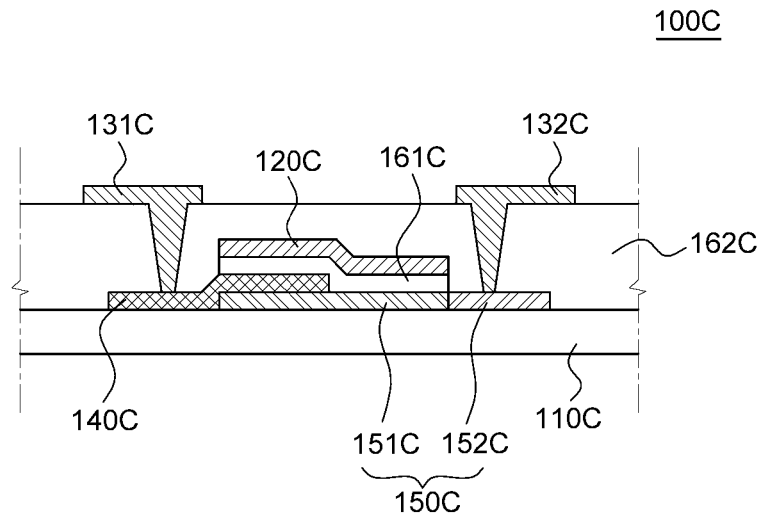
Figure 1D:
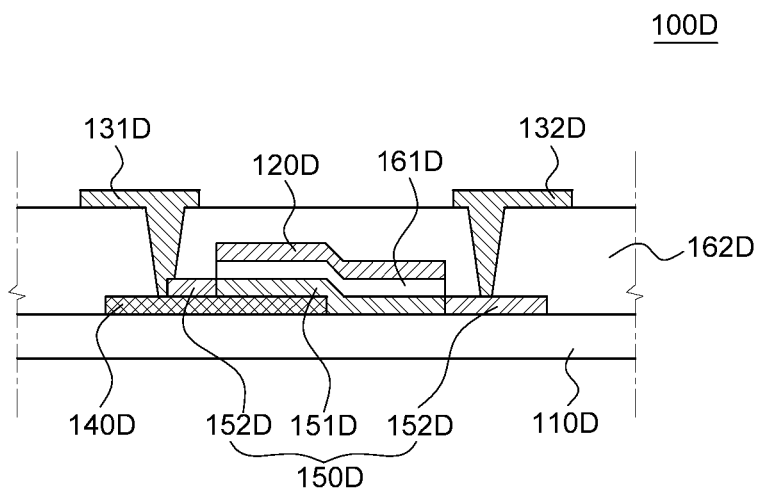

Although it has been illustrated in FIG. 1B that the conductive layer 140B is formed on a bottom surface of the active layer 150B, a conductive layer 140C may be formed on a top surface of an active layer 150C as shown in FIG. 1C. Further, as shown in FIG. 1D, a region of second regions 152D of an active layer 150D in contact with a source electrode 131D may be formed only on a partial region of a conductive layer 140D, and the source electrode 131D may come in contact with one end surface of the second region 152D of the active layer 150D and a top surface of the conductive layer 140D.

Figure 1E:
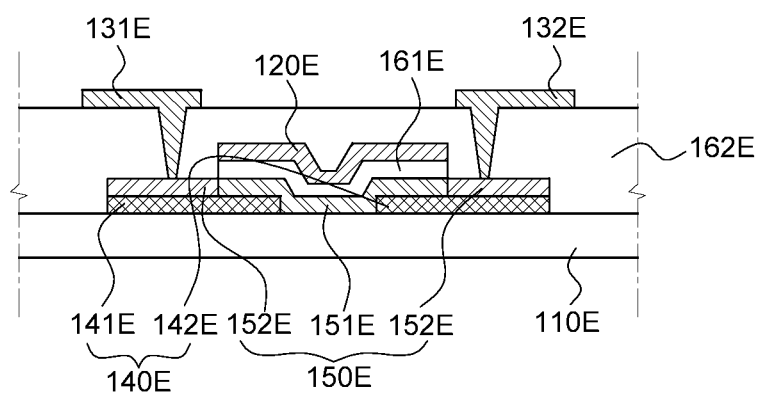

FIG. 1E is a cross-sectional view of a thin-film transistor according to an exemplary embodiment of the present invention.

In the exemplary embodiments shown in previous figures, the conductive layer (140A, 140B, 140C, 140D) is formed only at one end of the active layer (150A, 150B, 150C, 150D). In the some embodiments, however, the conductive layer 140E may be formed at both ends of an active layer 150E to be separated from each other, as illustrated in FIG. 1E. By doing this, it is possible to reduce a length of the channel region. For example, as shown in FIG. 1E, a first conductive layer 141E of the conductive layer 140E is formed below a source electrode 131E, and a second conductive layer 142E of the conductive layer 140E is formed below a drain electrode 132E. Accordingly, it is possible to further reduce a length of the channel region as compared with a case where one conductive layer is used. Although not shown in FIG. 1E, the source electrode 131E and the drain electrode 132E may be formed so as to come in direct contact with the first conductive layer 141E and the second conductive layer 142E without interposing the active layer 150E, similarly to the embodiment 100B illustrated in FIG. 1B. Similarly, other previously described embodiments may also be used in conjunction with the embodiment of FIG. 1E, for example the embodiment 100C of FIG. 1C regarding the relative order of stacking of the conductive and active layers, and the embodiment 100D of FIG. 1D regarding the lateral extent of the active layer with respect to the electrode and conductive layer.

Figure 1F:
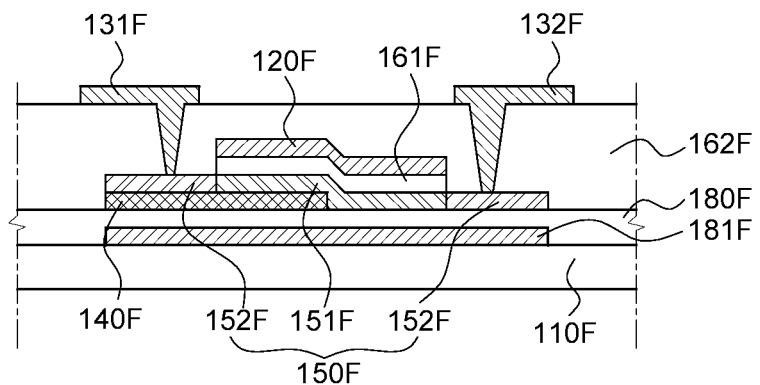

FIG. 1F is a cross-sectional view of a thin-film transistor according to an exemplary embodiment of the present invention. When light enters an active layer 150F made from the oxide semiconductor, the reliability of a thin-film transistor 100F may be affected. In order to minimize deterioration in reliability of the thin-film transistor 100F by the light, a light blocking layer 181F is further formed between a substrate 110F and an active layer 150F. Accordingly, the light blocking layer 181F is formed to prevent light entering from below the substrate 110F from reaching the active layer 150F. The light blocking layer 181F made from a reflective metal material is insulated from the active layer 150F and a conductive layer 140F by a buffer layer 180F which is formed on the substrate 110F and is made from an insulating material. As shown in FIG. 1F, when the conductive layer 140F is formed under the active layer 150F, the light blocking layer 181F and the conductive layer 140F can prevent light entering from below the substrate 110F from reaching the active layer 150F.

The buffer layer 180F functions to electrically insulate the light blocking layer 181F from the active layer 150F and the conductive layer 140F and may also function to prevent water or other impurities from infiltrating through the substrate 110F. A material constituting the buffer layer 180F may be selected depending on the functions of the buffering layer 180F, a type of the thin-film transistor, a constituent material of the thin-film transistor 100F in contact with the buffer layer 180F, and structural characteristics thereof. For example, the buffer layer 180F may be selected depending on interface characteristics with the active layer 150F according to the structure of the thin-film transistor 100F. In order to improve the function of preventing water and other impurities from infiltrating through the substrate 100F, the buffer layer may be a silicon oxide film, a silicon nitride film, or multiple layers including the silicon oxide film and the silicon nitride film. In addition, the buffer layer 180F may be formed of a plurality of layers with different refractive indices for scattering external light entering from the outside.

Figure 1G:
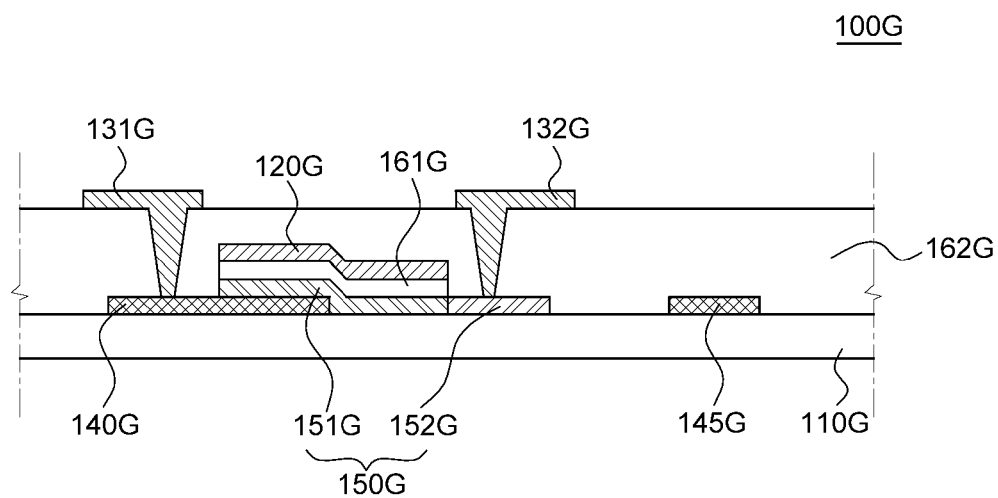

FIG. 1G is a cross-sectional view of a thin-film transistor according to an exemplary embodiment of the present invention.

A light scattering pattern 145G is formed on a substrate 110G. The light scattering pattern 145G may be made from a reflective metal material. The light scattering pattern 145G may be made from the substantially same material as that of a conductive layer 140G and may be simultaneously formed with the conductive layer. For example, the light scattering pattern 145G may be formed by forming a reflective metal material on the substrate 110G and removing the reflective metal material in regions except for regions corresponding to the conductive layer 140G and the light scattering pattern 145G.

The light scattering pattern 145G is formed to minimize light reaching the active layer 150G by scattering the light entering the active layer 150G. The light scattering pattern 145G may be formed close to a side surface of the active layer 150G on the substrate 110G. Specifically, the light scattering pattern 145G can scatter the entering light at the side surface of the active layer 150G to change a path of the light entering toward the active layer 150G. Accordingly, by minimizing the amount of the light that has reached the active layer 150G, it is possible to minimize deterioration in reliability of the thin-film transistor 100G due to the light. The light scattering pattern 145G is maintained in a floating state so as not to electrically affect the thin-film transistor.

Although it has been illustrated in FIG. 1G that one light scattering pattern 145G is formed, a plurality of light scattering patterns may be formed to be separated from each other within an allowed space if necessary. Further, by using the light scattering pattern 145G and a light blocking layer formed below the active layer 150G, it is possible to minimize deterioration in reliability of the thin-film transistor 100G due to the light entering the active layer 150G.

Further, the embodiments of FIGS. 1F and 1G may also be combined with the embodiments of any of FIGS. 1A-1E as the light blocking and light reflecting layers of FIGS. 1F and 1G do not affect the constructions of those other embodiments.

Figure 2A:
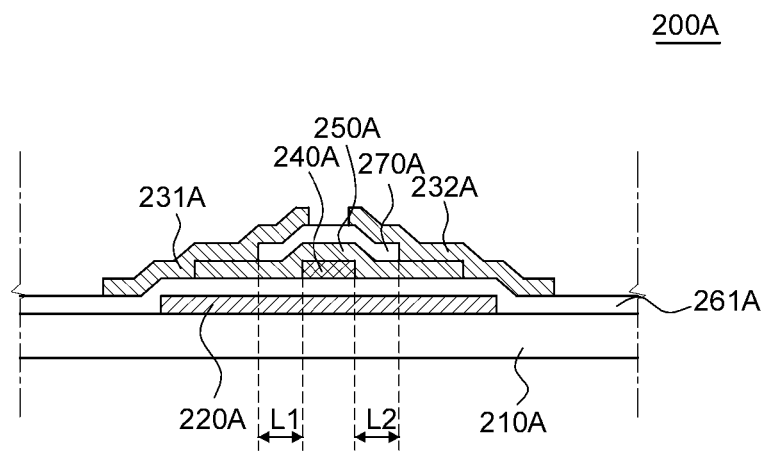
FIGS. 2A and 2B are cross-sectional views of thin-film transistors according to various exemplary embodiments of the present invention.

FIG. 2A is a cross-sectional view of a thin-film transistor according to an exemplary embodiment of the present invention. Referring to FIG. 2A, a thin-film transistor 200A includes a substrate 210A, a gate electrode 220A, a gate insulating film 261A, a conductive layer 240A, an active layer 250A, an etch stopper 270A, a source electrode 231A, and a drain electrode 232A. In FIG. 2A, among various thin-film transistors, a thin-film transistor having an inverted-staggered structure will be explained.

The gate electrode 220A is formed on the substrate 210A. The gate insulating film 261A is formed on the gate electrode 220A. The gate insulating film 261A insulates the active layer 250A from the gate electrode 220A. Since the gate insulating film 261A need to insulate the active layer 250A from the gate electrode 220A, the gate insulating film 261A may be formed to cover the gate electrode 220A on the gate electrode 220A. For example, as shown in FIG. 2A, the gate insulating film 261A may be formed over the entire surface of the substrate 210A to cover the gate electrode 220A.

The conductive layer 240A is formed on the gate insulating film 261A so as to be overlapped with the gate electrode 220A. The conductive layer 240A is formed to reduce a channel region of the thin-film transistor 200A, and may be made from a conductive metal material.

The active layer 250A is formed on the gate insulating film 261A and the conductive layer 240A. The active layer 250A may be formed to cover at least a part of the conductive layer 240A. The conductive layer 240A comes in contact with the active layer 250A, and is insulated from the gate electrode 220A.

The etch stopper 270A is formed on the active layer 250A, and the source electrode 231A and the drain electrode 232A are formed on the active layer 250A and the etch stopper 270A. The source electrode 231A and the drain electrode 232A may come in contact with the active layer 250A to be electrically connected to the active layer 250A, and may be formed on a partial region of the etch stopper 270A.

In the thin-film transistor 200A having a bottom gate structure in which the gate electrode 220A is positioned under the active layer 250A, when the active layer 250A is made from an oxide semiconductor, the active layer 250A including the oxide semiconductor may be damaged during an etching process on the source electrode 231A and the drain electrode 232A that are positioned on the active layer 250A. Thus, in order to prevent the active layer 250A from being modified by the etching, the etch stopper 270A made from an insulating material is formed on the active layer 250A, specifically, in a space between the source electrode 231A and the drain electrode 232A.

The substrate 210A, the active layer 250A, the gate insulating film 261A, the gate electrode 220A, the source electrode 231A and the drain electrode 232A may be made from the same materials as those of the substrate 110A, the active layer 150A, the gate insulating film 161A, the gate electrode 120A, the source electrode 131A and the drain electrode 132A shown in FIG. 1A and may have the same configurations as those thereof.

In the inverted-staggered type thin-film transistor, the shortest distance between a contact point of the source electrode 231A with the active layer 250A and a contact point of the drain electrode 232A with the active layer 250A, which is determined by the length of the etch stopper, forms the channel region. In the example shown in FIG. 2A, however, the conductive layer 240A being interposed between the active layer 250A and the gate insulating film 261A is overlapped with the part of the active layer 250A defined by the etch stopper 270A.

Accordingly, when a gate voltage is applied to the gate electrode 220A between the source electrode 231A and the drain electrode 232A to turn on the thin-film transistor 200A, current is allowed to intensively flow by the conductive layer 240A. The conductive layer 240A is made from a metal material and has a relatively higher carrier concentration than the portion of active layer 250A that it overlaps, In contrast, the active layer 250A is made from an oxide semiconductor, and has a relatively low carrier concentration compared to the conductive layer 240A. For this reason, a substantial channel length becomes a distance obtained by subtracting a length of the conductive layer 240A overlapped with the active layer 250A from a distance between the contact point of the source electrode 231A with the active layer 250A and the contact point of the drain electrode 232A with the active layer 250A. That is, since the channel length is a sum of a distance L1 between a portion of the active layer 250A in contact with the source electrode 231A and one end of the conductive layer 240A and a distance L2 between a portion of the active layer 250A in contact with the drain electrode 232A and the other end of the conductive layer 240A, it is possible to reduce a length of the channel by a length of the conductive layer 240A.

Figure 2B:
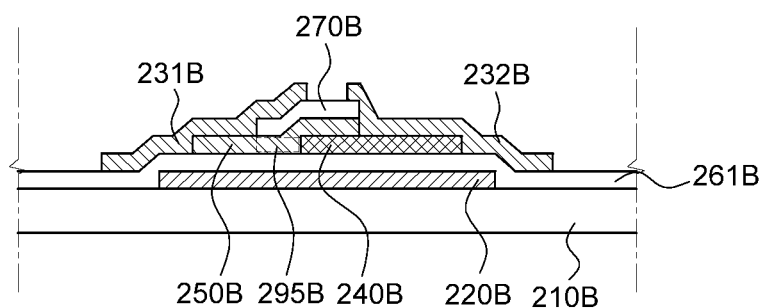

In a thin-film transistor 200B according to the exemplary embodiment of the present invention shown in FIG. 2B, a conductive layer 240B is formed so as to be overlapped with at least partial regions of a gate electrode 220B and an etch stopper 270B, and an active layer 250B is formed to cover a partial region of a conductive layer 240B.

When the conductive layer 240B is not used, the shortest distance between a contact point of the source electrode 231B with the active layer 250B and a contact point of the drain electrode 232B with the active layer 250B may be defined as a distance of the channel region. However, by forming the conductive layer 240B, a substantial distance of the channel region becomes a distance by subtracting a distance of the conductive layer 240B overlapped with the active layer 250B from the existing channel region, namely, a distance of a channel region 295B.

Accordingly, when a gate voltage is applied to the gate electrode 220B between the source electrode 231B and the drain electrode 232B to turn on the thin-film transistor 200B, since current is allowed to intensively flow by the conductive layer 240B having a carrier concentration relatively higher than that of the active layer 250B, it is possible to reduce a substantial length of the channel region on the active layer.

Figure 3A:
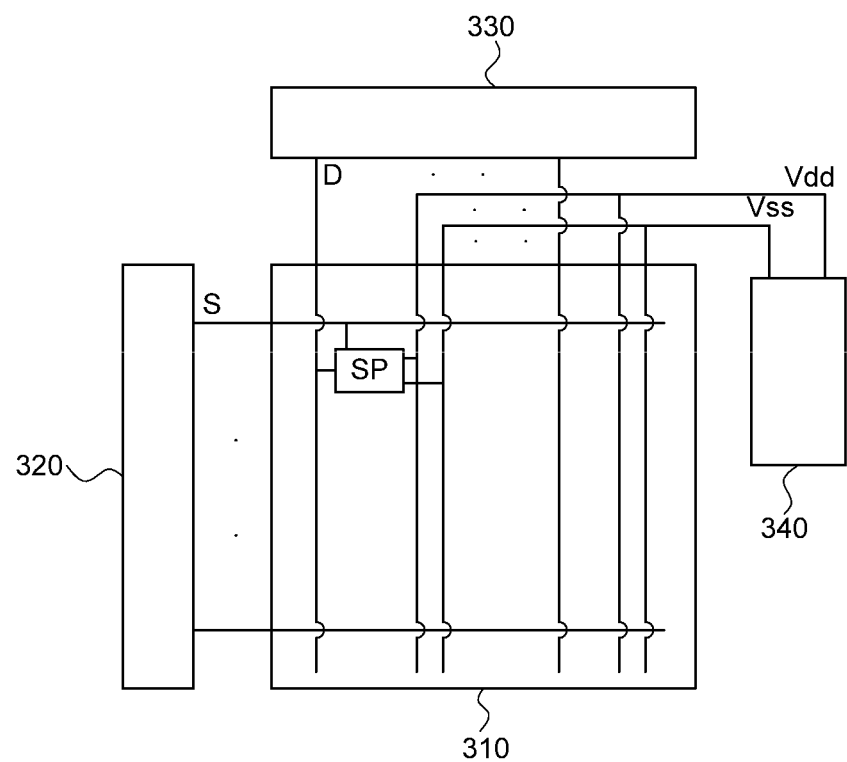
FIG. 3A is a schematic diagram of a display device according to an exemplary embodiment of the present invention.
Figure 3B:
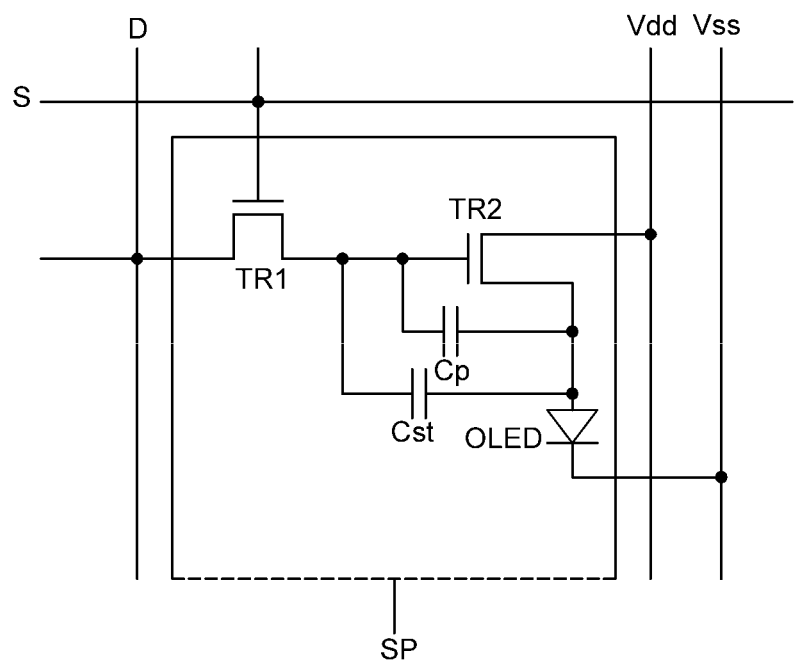
FIG. 3B is a schematic diagram illustrating a sub-pixel region depicted in FIG. 3A.

FIG. 3A is a conceptual diagram of a display device according to an exemplary embodiment of the present invention. FIG. 3B is an enlarged conceptual diagram of a sub-pixel region shown in FIG. 3A.

A display device 300 is a display device to which the thin-film transistors according to various exemplary embodiments of the present invention are applicable. The display device 300 is a device for displaying an image, and examples of the display device include various displayer devices, such as an organic light-emitting diode (OLED) device, a liquid crystal display (LCD) device, and an electrophoretic display (EPD) device. In FIG. 3A, among various display devices 300 to which thin-film transistors according to various exemplary embodiments of the present invention are applicable, an organic light-emitting diode device will be described as an example.

The display device 300 includes a substrate 310, at least one thin-film transistor, and an organic light-emitting diode (OLED) including an anode, an organic light-emitting layer and a cathode. At least one thin-film transistor for emitting the organic light-emitting layer is included in a plurality of sub-pixel regions SP of the substrate 310 of the display device 300. For example, as shown in FIG. 3B, two thin-film transistors of a switching transistor TR1 and a driving transistor TR2 may be included in the sub-pixel region SP, but the number of transistors is not limited thereto. Various thin-film transistors for a variety purposes may be further included in the sub-pixel region.

Referring to FIGS. 3A and 3B, the switching transistor TR1 includes a gate electrode connected to a gate wiring S extending from a gate driving module 320, a first electrode connected to a data wiring D extending from a data driving module 330, and a second electrode connected to a gate electrode of the driving transistor TR2. The first electrode and the second electrode of the switching transistor TR1 are a source electrode and a drain electrode, respectively, and the first electrode and the second electrode may be determined as one of the source electrode and the drain electrode depending on a kind of the switching transistor TR1. The driving transistor TR2 includes the gate electrode connected to the second electrode of the switching transistor TR1, a first electrode connected to a first power supply wiring Vdd extending from a power supply module 340, and a second electrode connected to the organic light-emitting diode (OLED). The first electrode and the second electrode of the driving transistor TR2 are a source electrode and a drain electrode, respectively and the first electrode and the second electrode may be determined as one of the source electrode and the drain electrode depending on a kind of the driving transistor TR2.

In this way, when two thin-film transistors of the switching transistor TR1 and the driving transistor TR2 are used, a first capacitor Cst is formed between the gate electrode of the driving transistor TR2 and the second electrode of the driving transistor TR2, and as a value of the first capacitor Cst increases, a voltage transmission rate of a data voltage increases. In this regard, the use of two thin-film transistors is effective.

Thus, when the thin-film transistors according to various exemplary embodiments of the present invention are applied to the driving transistor TR2 of the display device 300, that is, when the conductive layer which comes in contact with the active layer, is overlapped with at least a part of the gate electrode, and is insulated from the gate electrode is applied to the driving transistor TR2, since the conductive layer is overlapped with at least a part of the gate electrode, a second capacitor Cp is formed between the gate electrode and the conductive layer. Furthermore, when a region of the active layer in contact with the conductive layer comes in contact with the second electrode of the driving transistor TR2, the second capacitor Cp has a value different from that of the first capacitor Cst. However, since the second capacitor is connected to the first capacitor Cst in parallel, a total capacitor value of the gate electrode of the driving transistor TR2 and the second electrode of the driving transistor TR2 increases. Accordingly, when the thin-film transistors according to various exemplary embodiments of the present invention are applied to the driving transistor TR2 of the display device 300, since a capacitor value between the gate electrode of the driving transistor TR2 and the second electrode of the driving transistor TR2 increases, it is advantageous to a voltage transmission rate of a data voltage.

When the display device 300 is a transparent organic light-emitting diode display device, each of the plurality of sub-pixel regions SP of the organic light-emitting diode display device includes a light-emitting region and a light-transmitting region, and the thin-film transistor and the organic light-emitting diode may be arranged in the organic light-emitting region.

When the thin-film transistors according to various exemplary embodiments of the present invention are used in the display device 300, a design of the thin-film transistor may be partially changed depending on a kind of the display device 300. For example, when the display device 300 is a flexible display device, since the display device 300 needs to be repeatedly bent or folded, various elements constituting the thin-film transistor need to be easily bent or folded. Moreover, when the display device 300 is a transparent display device, even though the display device 300 is viewed from one side, the other side of the display device needs to be viewed to some extent. Accordingly, the various elements constituting the thin-film transistor may be considerably decreased in size, or may be made from transparent materials.

The display device may be a liquid crystal display device, and the liquid crystal display device includes a lower substrate, an upper substrate, a pixel electrode, a common electrode, a color filter and a liquid crystal layer interposed between the upper substrate and the lower substrate. The liquid crystal display device includes a plurality of pixel regions, and includes a plurality of thin-film transistors for individually driving the plurality of pixel regions.

When the thin-film transistors according to various exemplary embodiments of the present invention described with reference to FIGS. 1A to 2B are applied to the liquid crystal display device, the conductive layer may be formed below the drain electrode of the thin-film transistor. In FIGS. 1A to 2B, although it has been illustrated that the conductive layer is formed below the source electrode of the thin-film transistor, when the thin-film transistors according to various exemplary embodiments of the present invention are applied to the liquid crystal display device, the conductive layer may be formed below the drain electrode of the thin-film transistor so as to allow the capacitor formed between the conductive layer and the gate electrode to function as a storage capacitor.

Figure 4:
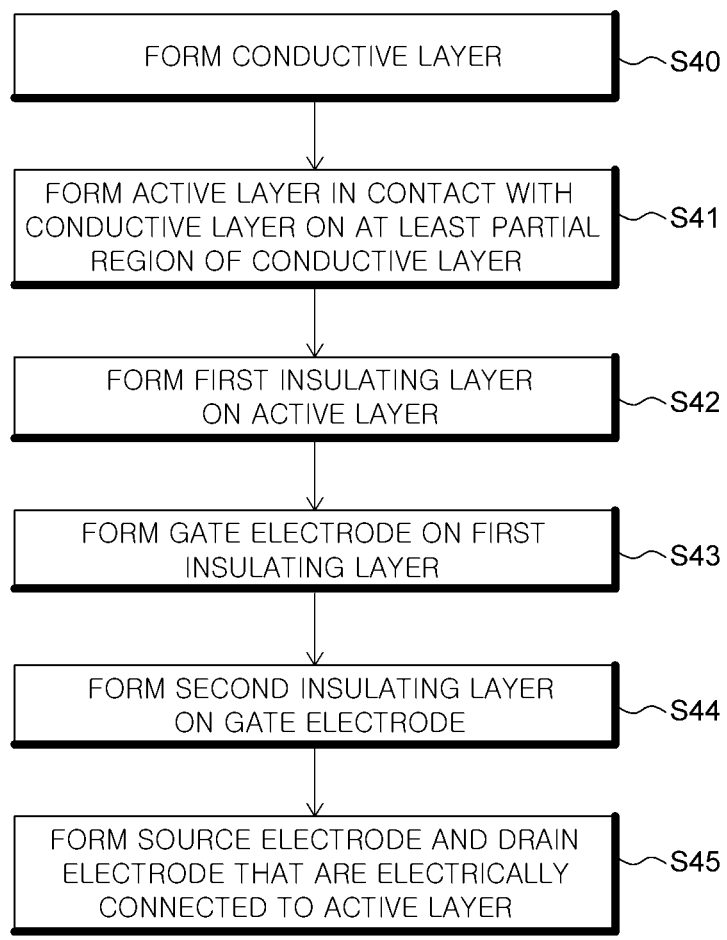
FIG. 4 is a flowchart describing a method for manufacturing a thin-film transistor according to an exemplary embodiment of the present invention.

FIG. 4 is a flowchart for describing a method for manufacturing a thin-film transistor according to an exemplary embodiment of the present invention. FIGS. 5A to 5E are cross-sectional views of processes for describing the method for manufacturing a thin-film transistor according to the exemplary embodiment of the present invention.

Firstly, a conductive layer is formed on a substrate (S40). A process of forming the conductive layer will be described in detail with reference to FIG. 5A.

Figure 5A:
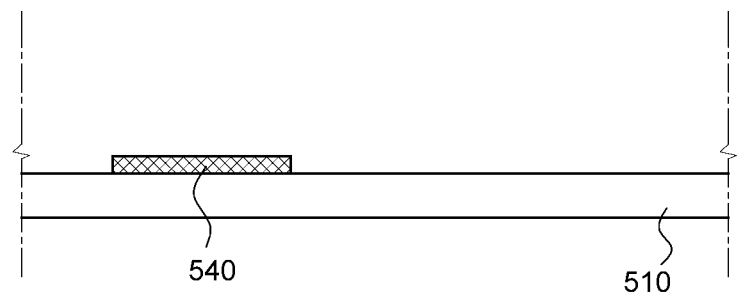
FIGS. 5A to 5E illustrate cross-sectional views of a TFT during the fabrication according to an exemplary method of manufacturing the thin-film transistor described in the present disclosure.

Referring to FIG. 5A, a conductive layer 540 is formed on a substrate 510. The forming of the conducting layer 540 may include forming a metal material for a conductive layer on the entire surface of the substrate 510 and selectively patterning the metal material for a conductive layer by a photolithography process.

Figure 5B:
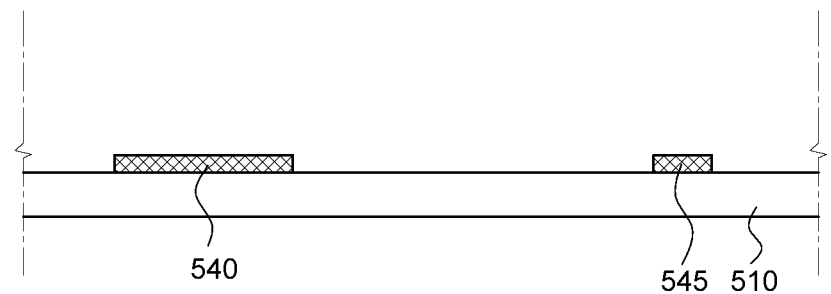

Referring to FIG. 5B, in some exemplary embodiments, a light scattering pattern 545 may be formed simultaneously with the conductive layer 540 and may be made from the same material as that of the conductive layer 540. The forming of the light scattering pattern 545 may include forming the light scattering pattern 545 simultaneously with the conductive layer 540 by forming the metal material for a conductive layer on the entire surface of the substrate 510 and selectively patterning the metal material for a conductive layer by a photolithography process.

Figure 5C:
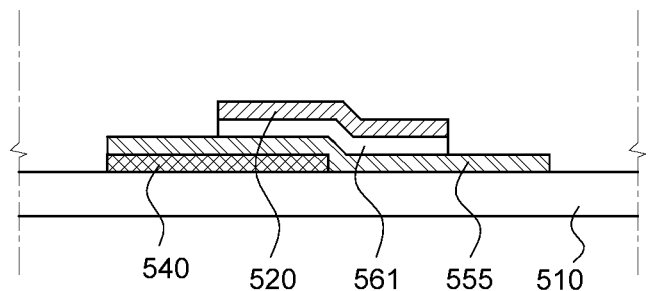
Figure 5D:
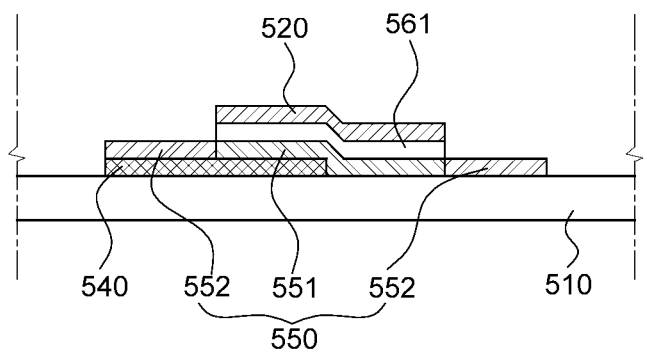

Subsequently, an active layer in contact with the conductive layer is formed on at least a part of the conductive layer (S41), a gate insulating film is formed on the active layer (S42), and then a gate electrode is formed on the gate insulating film (S43). Referring to FIG. 5C, an active layer 550 in contact with the conductive layer 540 is formed on at least a partial region of the conductive layer 540. The forming of the active layer 550 may include forming the active layer 550 by forming a semiconductor, which is a material for an active layer on the entire surface of the substrate 510 including the conductive layer 540 and selectively patterning the material for an active layer by a photolithography process. Although it has been illustrated in FIG. 5C that the active layer 550 is formed on the entire region of the conductive layer 540, the present invention is not limited thereto. The active layer 550 may be formed on a partial region of the conductive layer 540.

A gate insulating film 561 and a gate electrode 520 are formed on a partial region of the active layer 550 after forming the active layer 550. The forming of the gate insulating film 561 and the gate electrode 520 may include forming a material for a gate insulating film and a material for a gate electrode over the entire surface of the substrate 510 and selectively patterning the material for a gate insulating film and the material for a gate electrode by a photolithography process.

Thereafter, electrical conductivity may be given to a partial region of the active layer 550. The giving of the electrical conductivity to the partial region of the active layer 550 may include giving electrical conductivity to a partial region of the active layer 550 by using the gate electrode 520 as a mask. The giving of the electrical conductivity to the partial region of the active layer 550 is to reduce resistances of regions of the active layer 550 in contact with a source electrode 531 and a drain electrode 532. While electrical conductivity is not given to a first region 551 of the active layer 550 overlapped with the gate electrode 520 by using the gate electrode 520 as a mask, electrical conductivity may be given to only second regions 552 of the active layer 550 that are overlapped with the source electrode and the drain electrode.

Figure 5E:
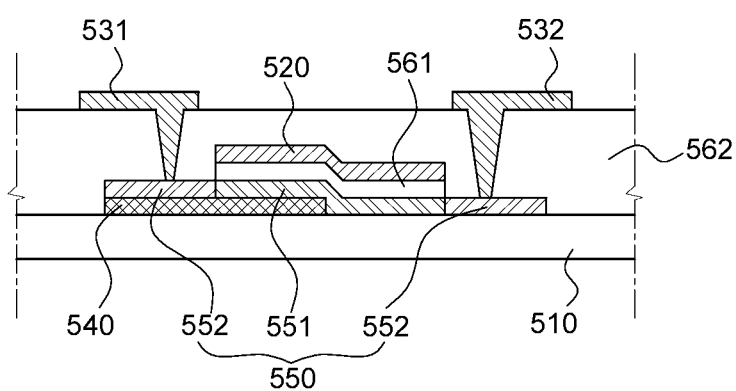

Subsequently, an interlayer insulating film is formed on the gate electrode (S44), and a source electrode and a drain electrode that are electrically connected to the active layer are formed (S45). Referring to FIG. 5E, the forming of an interlayer insulating film 562 may include forming contact holes for opening the second regions 552 of the active layer 550 by forming a material for an interlayer insulating film over the entire surface of the substrate 510 on which the gate electrode 520 is formed and selectively patterning the material for an interlayer insulating film by a photolithography process. The source electrode 531 and the drain electrode 532 that are electrically connected to the active layer 550 may be formed after forming the interlayer insulating film 562 including the contact holes.

The exemplary embodiments of the present invention have been described in detail with reference to the accompanying drawings, but the present invention is not limited to the exemplary embodiments. It will be apparent to those skilled in the art that various modifications can be made without departing from the spirit of the invention.

What is claimed is:
1. A thin-film transistor comprising:
a gate electrode disposed on an insulating layer;
an active layer disposed on a substrate below the insulating layer, the active layer comprising a first region that laterally overlaps with the gate electrode, a first portion of the first region comprising a channel of the transistor;
a source electrode and a drain electrode each electrically connected to the active layer; and
one or more conductive layers, each conductive layer electrically connected to either the source or drain electrode, and disposed between the active layer and the substrate, wherein each conductive layer laterally overlapping and directly physically contacting a second portion of the first region of the active layer to reduce a length of the channel.

2. The thin-film transistor of claim 1, wherein the active layer is formed with an oxide semiconductor material, and the one or more conductive layers are made of a conductive metal material.

3. The thin-film transistor of claim 1, wherein the gate electrode and said one or more conductive layers are physically separated at least by the insulating layer, thereby creating capacitance between the gate electrode and the one or more conductive layers.

4. The thin-film transistor of claim 1, wherein at least a portion of one of the conductive layers is interposed between the second portion of the first region of the active layer and the substrate.

5. The thin-film transistor of claim 1, wherein the second portion of the first region of the active layer is interposed between one of the conductive layers and the gate electrode.

6. The thin-film transistor of claim 1, wherein at least one of the source electrode and the drain electrode is in direct physical contact with a second region of the active layer, the second region laterally next to first region.

7. The thin-film transistor of claim 6, wherein the second region of the active layer has higher electrical conductivity than the first region of the active layer.

8. The thin-film transistor of claim 6, wherein one of either the source electrode or the drain electrode is electrically connected to the conductive layer, and the other is in direct physical contact with the second region of the active layer.

9. The thin-film transistor of claim 6, wherein one of the conductive layers is in direct physical contact with the second region of the active layer.

10. The thin-film transistor of claim 1, wherein said one or more conductive layers comprise:
a first conductive layer electrically connected to the source electrode; and
a second conductive layer electrically connected to the drain electrode.

11. The thin-film transistor of claim 10, wherein both the first and second conductive layers have a portion in direct physical contact with the second portion of the first region of the active layer such that the length of the channel corresponds to a distance between a first end of the first conductive layer and a second end of the second conductive layer facing the first end.

12. The thin-film transistor of claim 10, wherein both the first and second conductive layers are a light blocking layer interposed between the substrate and the active layer.

13. The thin-film transistor of claim 1, further comprising a light scattering pattern, wherein the light scattering pattern and said one or more conductive layers are formed of a same material.

14. A thin-film transistor, comprising:
an active layer disposed on a substrate;
a gate electrode disposed below the active layer;
a source electrode and a drain electrode that are electrically connected to the active layer;
a gate insulating film disposed between the active layer and the gate electrode; and
a conductive layer in direct physical contact with the active layer, and disposed on the gate insulating film,
wherein the conductive layer is configured to laterally overlap with both at least a portion of the gate electrode and a portion of the gate insulating film.

15. The thin-film transistor of claim 14, wherein the gate electrode is formed below the active layer, the transistor further comprising:
an etch stopper that is formed above the active layer,
wherein the conductive layer is completely overlapped by the etch stopper.

16. A thin-film transistor, comprising:
a gate electrode on a substrate;
a gate insulating film on the gate electrode;
an active layer above the gate electrode, the active layer comprising two channel regions that allow carriers to flow;
a conductive layer directly contacted to the active layer, overlapped with at least a part of the gate electrode and insulated from the gate electrode; and
a source electrode and a drain electrode electrically connected to the active layer,
wherein one of the two channel regions is a first area between a first portion of the active layer in contact with the source electrode and one end of the conductive layer, and the other of the two channel regions is second area between a second portion of the active layer in contact with the drain electrode and the other end of the conductive layer.

17. The thin-film transistor of claim 16, further comprising:
an etch stopper made from an insulating material and on the active layer in a space between the source electrode and the drain electrode, the etch stopper being configured to prevent the active layer from being modified by etching.

18. The thin-film transistor of claim 17, wherein a length of the channel region in the active layer is less than a length of the etch stopper.

19. The thin-film transistor of claim 17, wherein the conductive layer is interposed between the active layer and the gate insulating film, and is overlapped with a part of the active layer defined by the etch stopper.

* * * * *